United States Patent [19]

Takada et al.

[11] Patent Number: 5,384,507

[45] Date of Patent: Jan. 24, 1995

[54] METHOD OF AND DEVICE FOR DRIVING PIEZO-ELECTRIC ELEMENTS AND SYSTEM FOR CONTROLLING MICROMOTION MECHANISM

[75] Inventors: Ryuji Takada; Eiichi Hazaki, both of Tsuchiura, Japan

[73] Assignee: Hitachi Construction Machinery Co., Ltd., Tokyo, Japan

[21] Appl. No.: 90,218

[22] PCT Filed: Nov. 30, 1992

[86] PCT No.: PCT/JP92/01569

§ 371 Date: Jul. 19, 1993

§ 102(e) Date: Jul. 19, 1993

[30] Foreign Application Priority Data

Nov. 29, 1991 [JP] Japan .................. 3-316823

[51] Int. Cl.⁶ .......................... H01L 41/09
[52] U.S. Cl. ................................ 310/317
[58] Field of Search ................. 310/316–318

[56] References Cited

U.S. PATENT DOCUMENTS

| | | | |
|---|---|---|---|
| 4,343,993 | 8/1982 | Binnig et al. | 250/306 |
| 4,941,753 | 7/1990 | Wickramasinghe | 374/120 |
| 4,992,659 | 2/1991 | Abraham et al. | 250/306 |
| 5,051,646 | 9/1991 | Elings et al. | 310/317 |
| 5,116,782 | 5/1992 | Yamaguchi et al. | 437/172 |
| 5,128,544 | 7/1992 | Iwatsuki | 310/328 |
| 5,129,132 | 7/1992 | Zdeblick et al. | 310/325 |
| 5,155,715 | 10/1992 | Ueyema et al. | 369/44.11 |
| 5,251,200 | 10/1993 | Hatanaka et al. | 369/126 |
| 5,255,258 | 10/1993 | Kawade et al. | 369/126 |

FOREIGN PATENT DOCUMENTS

| | | | |
|---|---|---|---|
| 55-33295 | 3/1980 | Japan | G05D 23/20 |
| 58-84304 | 5/1983 | Japan | G05B 11/36 |
| 63-310378 | 12/1988 | Japan | H02N 2/00 |
| 1-174905 | 7/1989 | Japan | G01B 11/02 |
| 2205680 | 12/1988 | United Kingdom | 310/316 |

*Primary Examiner*—Thomas M. Dougherty
*Attorney, Agent, or Firm*—Fay, Sharpe, Beall, Fagan, Minnich & McKee

[57] ABSTRACT

Set with respect to the piezo-electric element (1) is an approximate expression representing a relationship between the amplitude ($\Delta V$) of the applied voltage range, a reference voltage (Vo) relative to the applied voltage range and an amount of displacement (G) of the piezo-electric element per unit voltage. There is obtained the amplitude ($\Delta V$) of the applied voltage range for producing the target amount of displacement in the reference voltage by inputting the target amount of displacement ($\Delta X$) and the reference voltage (Vo) and using the approximate expression. The applied voltage range (Vmin~Vmax) for producing the target amount of displacement is determined from the obtained amplitude of the applied voltage range and the inputted reference voltage (Vo). The voltage is applied to the piezo-electric element on the basis of the applied voltage range determined. It is therefore possible to cause highly accurate displacements without using a special displacement measuring device. Prepared are approximate expressions utilizing a linear expression and a quadratic expression depending on the accuracies required.

33 Claims, 11 Drawing Sheets

FIG.5

| DATA No. | VOLTAGE RANGE (V) | CENTRAL VOLTAGE $V_0$ (V) | VOLTAGE AMPLITUDE $\Delta V$ (V) | DISPLACEMENT AMOUNT PER UNIT VOLTAGE $G_m$ ($\mu$m/20V) |
|---|---|---|---|---|
| 1 | 45⇌55 | 50 | 10 | 2.12 |
| 2 | 40⇌60 | 50 | 20 | 2.25 |
| 3 | 35⇌65 | 50 | 30 | 2.37 |
| 4 | 30⇌70 | 50 | 40 | 2.48 |
| 5 | 20⇌80 | 50 | 60 | 2.64 |
| 6 | 0⇌100 | 50 | 100 | 2.84 |
| 7 | 15⇌25 | 20 | 10 | 2.20 |
| 8 | 10⇌30 | 20 | 20 | 2.40 |
| 9 | 5⇌35 | 20 | 30 | 2.58 |
| 10 | 0⇌40 | 20 | 40 | 2.74 |
| 11 | 75⇌85 | 80 | 10 | 1.84 |
| 12 | 70⇌90 | 80 | 20 | 1.93 |
| 13 | 65⇌95 | 80 | 30 | 2.02 |
| 14 | 60⇌100 | 80 | 40 | 2.08 |

FIG. 6

$$\mathbb{C} = \begin{bmatrix} \Sigma x_i^2 y_i^2 & \Sigma x_i^2 y_i & \Sigma x_i y_i^2 & \Sigma x_i y_i \\ \Sigma x_i^2 y_i & \Sigma x_i^2 & \Sigma x_i y_i & \Sigma x_i \\ \Sigma x_i y_i^2 & \Sigma x_i y_i & \Sigma y_i^2 & \Sigma y_i \\ \Sigma x_i y_i & \Sigma x_i & \Sigma y_i & \Sigma 1 \end{bmatrix}$$

FIG. 7

$$\begin{bmatrix} a \\ b \\ c \\ d \end{bmatrix} = \mathbb{C}^{-1} \begin{bmatrix} \Sigma x_i y_i z_i \\ \Sigma x_i z_i \\ \Sigma y_i z_i \\ \Sigma z_i \end{bmatrix}$$

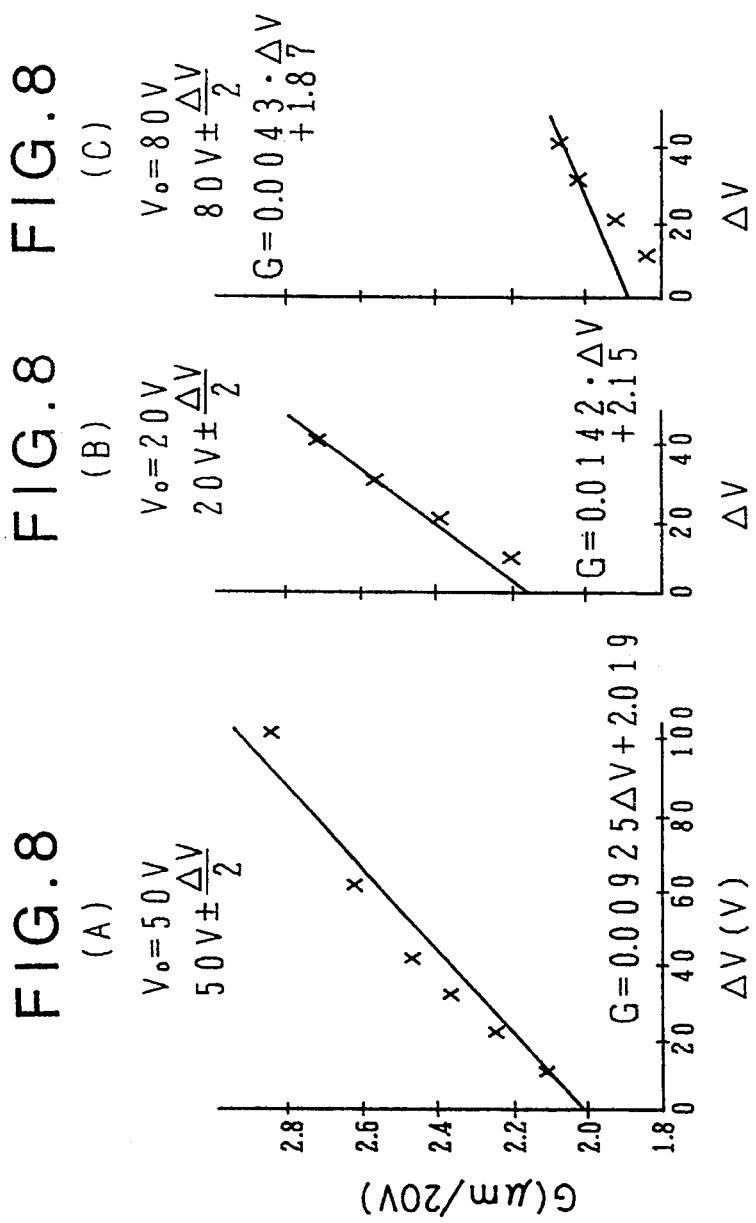

FIG. 9

| VOLTAGE RANGE (V) | CENTRAL VOLTAGE Vo (V) | VOLTAGE AMPLITUDE ΔV (V) | Gm ACTUALLY MEASURED VALUES PER UNIT VOLTAGE (μm/100V) | DISPLACEMENT AMOUNT PER UNIT VOLTAGE CALCULATED WITH APPROXIMATE VALUE (μm/100V) | ERROR BETWEEN Gm AND G |
|---|---|---|---|---|---|
| 0-100 | 50.0 | 100 | 7.84 | 7.83 | -.1 |
| 0-100 | 50.0 | 100 | 7.84 | 7.83 | -.1 |
| 0-100 | 50.0 | 100 | 7.85 | 7.83 | -.3 |
| 0-100 | 50.0 | 100 | 7.85 | 7.83 | -.3 |
| 0-100 | 50.0 | 100 | 7.85 | 7.83 | -.3 |
| 0-90 | 45.0 | 90 | 7.91 | 7.94 | .4 |
| 10-100 | 55.0 | 90 | 7.54 | 7.54 | 0.0 |
| 0-80 | 40.0 | 80 | 7.93 | 7.99 | .8 |
| 10-90 | 50.0 | 80 | 7.58 | 7.62 | .6 |
| 20-100 | 60.0 | 80 | 7.22 | 7.23 | .1 |
| 0-60 | 30.0 | 60 | 7.85 | 7.86 | .1 |
| 10-70 | 40.0 | 60 | 7.58 | 7.57 | -.1 |
| 20-80 | 50.0 | 60 | 7.26 | 7.26 | -0.0 |
| 30-90 | 60.0 | 60 | 6.90 | 6.92 | .3 |
| 40-100 | 70.0 | 60 | 6.55 | 6.56 | .1 |
| 0-50 | 25.0 | 50 | 7.68 | 7.68 | -0.0 |
| 10-60 | 35.0 | 50 | 7.50 | 7.43 | -.9 |
| 25-75 | 50.0 | 50 | 7.03 | 7.02 | -.2 |
| 40-90 | 65.0 | 50 | 6.51 | 6.55 | .5 |
| 50-100 | 75.0 | 50 | 6.21 | 6.20 | -.1 |
| 0-40 | 20.0 | 40 | 7.39 | 7.42 | .3 |
| 10-50 | 30.0 | 40 | 7.29 | 7.21 | -1.0 |
| 20-60 | 40.0 | 40 | 7.05 | 6.99 | -.8 |
| 40-80 | 60.0 | 40 | 6.44 | 6.46 | .3 |
| 60-100 | 80.0 | 40 | 5.87 | 5.84 | -.4 |
| 0-20 | 10.0 | 20 | 6.58 | 6.64 | .8 |
| 10-30 | 20.0 | 20 | 6.55 | 6.53 | -.2 |
| 20-40 | 30.0 | 20 | 6.48 | 6.40 | -1.1 |
| 40-60 | 50.0 | 20 | 6.05 | 6.06 | .1 |
| 60-80 | 70.0 | 20 | 5.53 | 5.62 | 1.2 |
| 80-100 | 90.0 | 20 | 5.16 | 5.09 | -.9 |
| 0-10 | 5.0 | 10 | 6.07 | 6.12 | .7 |
| 5-15 | 10.0 | 10 | 6.06 | 6.09 | .4 |
| 10-20 | 15.0 | 10 | 5.99 | 6.06 | .9 |
| 20-30 | 25.0 | 10 | 5.94 | 5.97 | .4 |
| 45-55 | 50.0 | 10 | 5.66 | 5.66 | -0.0 |
| 70-80 | 75.0 | 10 | 5.09 | 5.19 | 1.3 |
| 90-100 | 95.0 | 10 | 4.75 | 4.72 | -.4 |
| 0-5 | 2.5 | 5 | 5.84 | 5.83 | -.2 |
| 5-10 | 7.5 | 5 | 5.86 | 5.81 | -.6 |
| 10-15 | 12.5 | 5 | 5.80 | 5.79 | -.1 |
| 20-25 | 22.5 | 5 | 5.78 | 5.73 | -.6 |
| 40-45 | 42.5 | 5 | 5.64 | 5.54 | -1.3 |
| 60-65 | 62.5 | 5 | 5.22 | 5.25 | .4 |
| 80-85 | 82.5 | 5 | 4.82 | 4.88 | .7 |
| 90-100 | 97.5 | 5 | 4.57 | 4.53 | -.5 |

FIG.10

$$\mathbb{C} = \begin{Bmatrix} \Sigma x_i^4 y_i^4 & \Sigma x_i^4 y_i^3 & \Sigma x_i^4 y_i^2 & \Sigma x_i^3 y_i^4 & \Sigma x_i^3 y_i^3 & \Sigma x_i^3 y_i^2 & \Sigma x_i^2 y_i^4 & \Sigma x_i^2 y_i^3 & \Sigma x_i^2 y_i^2 \\ \Sigma x_i^4 y_i^3 & \Sigma x_i^4 y_i^2 & \Sigma x_i^4 y_i & \Sigma x_i^3 y_i^3 & \Sigma x_i^3 y_i^2 & \Sigma x_i^3 y_i & \Sigma x_i^2 y_i^3 & \Sigma x_i^2 y_i^2 & \Sigma x_i^2 y_i \\ \Sigma x_i^4 y_i^2 & \Sigma x_i^4 y_i & \Sigma x_i^4 & \Sigma x_i^3 y_i^2 & \Sigma x_i^3 y_i & \Sigma x_i^3 & \Sigma x_i^2 y_i^2 & \Sigma x_i^2 y_i & \Sigma x_i^2 \\ \Sigma x_i^3 y_i^4 & \Sigma x_i^3 y_i^3 & \Sigma x_i^3 y_i^2 & \Sigma x_i^2 y_i^4 & \Sigma x_i^2 y_i^3 & \Sigma x_i^2 y_i^2 & \Sigma x_i y_i^4 & \Sigma x_i y_i^3 & \Sigma x_i y_i^2 \\ \Sigma x_i^3 y_i^3 & \Sigma x_i^3 y_i^2 & \Sigma x_i^3 y_i & \Sigma x_i^2 y_i^3 & \Sigma x_i^2 y_i^2 & \Sigma x_i^2 y_i & \Sigma x_i y_i^3 & \Sigma x_i y_i^2 & \Sigma x_i y_i \\ \Sigma x_i^3 y_i^2 & \Sigma x_i^3 y_i & \Sigma x_i^3 & \Sigma x_i^2 y_i^2 & \Sigma x_i^2 y_i & \Sigma x_i^2 & \Sigma x_i y_i^2 & \Sigma x_i y_i & \Sigma x_i \\ \Sigma x_i^2 y_i^4 & \Sigma x_i^2 y_i^3 & \Sigma x_i^2 y_i^2 & \Sigma x_i y_i^4 & \Sigma x_i y_i^3 & \Sigma x_i y_i^2 & \Sigma y_i^4 & \Sigma y_i^3 & \Sigma y_i^2 \\ \Sigma x_i^2 y_i^3 & \Sigma x_i^2 y_i^2 & \Sigma x_i^2 y_i & \Sigma x_i y_i^3 & \Sigma x_i y_i^2 & \Sigma x_i y_i & \Sigma y_i^3 & \Sigma y_i^2 & \Sigma y_i \\ \Sigma x_i^2 y_i^2 & \Sigma x_i^2 y_i & \Sigma x_i^2 & \Sigma x_i y_i^2 & \Sigma x_i y_i & \Sigma x_i & \Sigma y_i^2 & \Sigma y_i & \Sigma 1 \end{Bmatrix}$$

FIG.11

$$\begin{Bmatrix} k_{22} \\ k_{21} \\ k_{20} \\ k_{12} \\ k_{11} \\ k_{10} \\ k_{02} \\ k_{01} \\ k_{00} \end{Bmatrix} = \mathbb{C}^{-1} \begin{Bmatrix} \Sigma x^2 y^2 z \\ \Sigma x^2 y\, z \\ \Sigma x^2 z \\ \Sigma x\, y^2 z \\ \Sigma x\, y\, z \\ \Sigma x\, z \\ \Sigma y^2 z \\ \Sigma y\, z \\ \Sigma z \end{Bmatrix}$$

METHOD OF AND DEVICE FOR DRIVING PIEZO-ELECTRIC ELEMENTS AND SYSTEM FOR CONTROLLING MICROMOTION MECHANISM

TECHNICAL FIELD

The present invention relates generally to a method of and device for driving piezo-electric elements and a system for controlling a micromotion mechanism and, more particularly, to a method of and device for driving piezo-electric elements applied to a micromotion mechanism for infinitesimally shifting a position of a probe of a scan type probe microscope such as a scan type tunnel microscope, and utilized as piezo-electric actuators for producing displacements and a system for controlling the micromotion mechanism thereof.

BACKGROUND ARTS

Hitherto, in a scan type tunnel microscope as a typical example of a scan type probe microscope, an atom-sized rugged configuration on the surface of a sample is measured by use of a probe. For this purpose, the tunnel type microscope incorporates a micromotion mechanism constructed to utilize the piezo-electric elements. This micromotion mechanism is constructed to infinitesimally control a position of the probe by utilizing elongating/shrinking action of the piezo-electric elements. A tripod type micromotion mechanism for the probe includes three pieces of piezo-electric elements, i.e., a piezo-electric element (for the Z-axis) for controlling a distance between the probe and the sample surface and two piezo-electric elements (for the X- and Y-axes) for causing the probe to scan a measurement target area on the sample surface. These piezo-electric elements are elongated and shrunk in the longitudinal directions by applying voltages thereto. Lengths thereof are varied by regulating the applied voltages, whereby the displacements needed can be produced.

In such a micromotion mechanism of the tunnel type microscope, when elongating the two piezo-electric elements for causing the probe to effect scanning by applying the voltages respectively thereto, amounts of displacement within a range where voltages on the order of 0~100 V are usable are normally proportionally distributed according to voltage subranges corresponding to scan areas. The amounts of displacement caused in these voltage subranges are presumed. Under this presumption, the piezo-electric elements are driven in these voltage subranges.

On the other hand, for instance, JP, A, 1-174905 discloses a micromotion mechanism for use with a device such as a semiconductor micromotion positioning device in which a space is relatively easily ensured. This micromotion mechanism performs the control to produce the displacements exhibiting a high accuracy and is therefore provided separately with a displacement measuring device for measuring actual amounts of displacement. This displacement measuring device generally involves the use of a laser displacement gauge, an electrostatic capacity type displacement gauge, a strain gauge, etc.

DISCLOSURE OF INVENTION

The method of driving the piezo-electric elements in the conventional micromotion mechanism, however, presents the following problems.

To start with, a relationship between the voltages applied to the piezo-electric elements and the displacement produced therein will be explained. FIGS. 1 and 2 each show one example of the relationship between the voltages applied to the piezo-electric elements and the displacements produced therein. FIGS. 1 and 2 show displacement characteristics with respect to the same piezo-electric elements. Referring to FIG. 1, the range of the applied voltages is set to 0~100 V. In FIG. 2, the range of the applied voltages is set to 80~100 V. According to the displacement characteristic shown in FIG. 1, an amount of displacement is 14.3 μm with a potential difference of 100 V. Contrastingly, according to the displacement characteristic shown in FIG. 2, the amount of displacement is 1.9 μm with a potential difference of 20 V. When comparing these displacement characteristics through a conversion into an amount of displacement per 20 V, the displacement characteristic in FIG. 1 exhibits 2.86 μm/20 V, while the displacement characteristic in FIG. 2 exhibits 1.9 μm/20 V. The piezo-electric elements are the same, yet there is exhibited such a characteristic that the amount of displacement of the piezo-electric element per unit voltage largely differs depending on the range of the applied voltages.

As discussed above, when elongating the piezo-electric elements by applying the voltages thereto, generally the amounts of displacement within the range of the applied voltages on the order of 0~100 V are proportionally distributed according to the voltage subranges, respectively. The amounts of displacement in the voltage subranges are thereby presumed, and the piezo-electric elements are driven in those voltage subranges. For example, an explanation will be given by way of examples shown in FIG. 1 and 2. The piezo-electric element shifts by 14.3 μm in the range of 0~100 V. Hence, it is simply assumed that there is a variation for 20 V in the range of 80~100 V. It is considered that there is caused a displacement defined by 14.3/5=2.86 μm. The piezo-electric element is driven in that voltage range (80~100 V). However, in the voltage range of 80~100 V, as obvious from FIG. 2, actually the displacement is as infinitesimal as 1.9 μm. This implies that there is induced an error given by:

$$(1 - 1.9/2.86) \times 100 = 33\%$$

As described above, the amount of displacement of the piezo-electric element per unit voltage largely differs according to the applied voltage range. For this reason, a proportional relationship is simply applied to the relationship between the applied voltage range and the displacement range on the basis of the displacement characteristics obtained corresponding to the voltage range for producing a maximum displacement range. Driving for the elongation thereof is conducted on the assumption of the displacement range corresponding to a part of the applied voltage range, resulting in an occurrence of a large error.

In the micromotion mechanism constructed to utilize the piezo-electric elements having the displacement characteristics stated above, the error is largely caused when the drive is controlled, wherein only the voltages applied to the piezo-electric elements serve as control data. Therefore, the micromotion mechanism for effecting the control to produce the highly accurate displacements is, as explained earlier, provided separately with a displacement measuring device such as a laser displacement gauge for gauging the actual amount of displacement, an electrostatic capacity type displacement gauge, a strain gauge, etc. If equipped with this kind of displacement measuring device, however, the device becomes expensive in any case. Further, extra space for accommodating the displacement measuring device is needed. This leads to an increase in size of the whole device. At the same time, the micromotion mechanism of the scan type probe microscope is incapable of ensuring such a space, and thus cannot be applied thereto.

It is a primary object of the present invention to provide a method of and device for driving piezo-electric elements and a system for controlling a micromotion mechanism that are capable of producing highly accurate displacements without using a special displacement measuring device by properly setting applied voltages for producing the displacements.

To accomplish the foregoing object, according to this invention, there is provided a method of driving piezo-electric elements by setting an amplitude ($\Delta V$) of a range of voltages applied to the piezo-electric elements (1) in accordance with a target amount of displacement ($\Delta X$), applying the voltages to the piezo-electric elements in accordance with the amplitude of the applied voltage range and causing the target amount of displacement, the method comprising the steps of: (a) setting an approximate expression representing a relationship between the amplitude ($\Delta V$) of the applied voltage range, a reference voltage ($Vo$) relative to the applied voltage range and an amount of displacement ($G$) per unit voltage of the piezo-electric element with respect to the piezo-electric element (1); (b) obtaining the amplitude ($\Delta V$) of the applied voltage range for producing the target amount of displacement in the reference voltage by inputting the target amount of displacement ($\Delta X$) and the reference voltage ($Vo$) and using the approximate expression; (c) determining the applied voltage range ($Vmin \sim Vmax$) for producing the target amount of displacement from the obtained amplitude of the applied voltage range and the inputted reference voltage ($Vo$); and (d) applying the voltage to the piezo-electric element on the basis of the applied voltage range determined.

According to the present invention having the construction given above, the applied voltage range for producing the target amount of displacement is determined, as explained above, by use of the approximate expression while inputting the target amount of displacement and the reference voltage. The voltages are applied to the piezo-electric elements. The approximate expression is set in consideration of the displacement characteristics of the piezo-electric elements that have been employed beforehand. Reduced consequently is an error caused due to the displacement characteristics of the piezo-electric elements whose amounts of displacement differ depending on the applied voltage range. It is therefore possible to generate the displacements exhibiting the high accuracy without employing the special displacement measuring device. Further, the reference voltage relative to the applied voltage range is inputted in combination with inputting of the target amount of displacement. It is therefore possible to select what location to employ in the voltage range where the piezo-electric element is usable.

In the driving method described above, preferably, the approximate expression set by the step (a) is a linear function of the amplitude ($\Delta V$) of the applied voltage range, the reference voltage ($Vo$) and the amount of displacement ($G$) per unit voltage. Preferably, the approximate expression set by the step (a) is expressed such as:

$$G = aVo\Delta V + bVo + c\Delta V + d$$

where $\Delta V$ is the amplitude of the applied voltage range, $Vo$ is the reference voltage, $G$ is the amount of displacement per unit voltage, and a, b, c, d are coefficients determined depending on displacement characteristics of the piezo-electric elements (1).

Further, in the driving method described above, the approximate expression set by the step (a) is a quadratic expression of the amplitude ($\Delta V$) of the applied voltage range, the reference voltage ($Vo$) and the amount of displacement ($G$) per unit voltage. Preferably, the approximate expression set by the step (a) is expressed such as:

$$G = k_{22}Vo^2\Delta V^2 + k_{21}Vo^2\Delta V + k_{20}Vo^2 + k_{12}Vo\Delta V^2 + k_{11}Vo\Delta V + k_{10}Vo + k_{02}\Delta V^2 + k_{01}\Delta V + k_{00}$$

where $\Delta V$ is the amplitude of the applied voltage range, $Vo$ is the reference voltage, $G$ is the amount of displacement per unit voltage, and $k_{22}$, $k_{21}$, $k_{20}$, $k_{12}$, $k_{11}$, $k_{10}$, $k_{02}$, $k_{01}$, $k_{00}$ are coefficients determined depending on the displacement characteristics of the piezo-electric elements.

In the approximate expression given above, the linear expression is applied when effecting a simple approximation. The quadratic expression is applied when performing a more precise approximation. The approximate expressions are selected according to the accuracies required and then utilized.

Still further, in the driving method described above, the reference voltage ($Vo$) is a voltage value centered in the amplitude ($\Delta V$) of the applied voltage range. Preferably, the reference voltage ($Vo$) may be a maximum voltage value ($Vmax$) or a minimum voltage value ($Vmin$) of the amplitude ($\Delta V$) of the applied voltage range.

Moreover, the driving method described above further comprises the steps of, preferably, setting further a first relational expression between the target amount of displacement ($\Delta X$), the amplitude ($\Delta V$) of the applied voltage range and the amount of displacement ($G$) per unit voltage, and obtaining the amplitude ($\Delta V$) of the applied voltage range for producing the target amount of displacement in the reference voltage from the inputted target amount of displacement, the reference voltage ($Vo$), the approximate expression and the first relational expression in the step (b). In this case, the first relational expression is $$G = \Delta X(A/\Delta V)$$

where $\Delta X$ is the target amount of displacement, $\Delta V$ is the amplitude of the applied voltage range, $G$ is the amount of displacement per unit voltage, and $A$ is the unit voltage.

Furthermore, the driving method described above further comprises the steps of, preferably, setting further a second relational expression for determining the applied voltage range ($Vmin \sim Vmax$) for producing the target amount of displacement ($\Delta X$) from the amplitude ($\Delta V$) of the applied voltage range and the reference voltage ($Vo$), and determining the applied voltage range ($Vmin \sim Vmax$) for producing the target amount of displacement from the amplitude of the applied voltage range that has been obtained by use of the approximate expression, the inputted reference voltage (Vo) and the second relational expression in the step (c). In this case, the second relational expression is $$Vmin = Vo - (\Delta V/2)$$

$$Vmax = Vo + (\Delta V/2)$$

where ΔV is the amplitude of the applied voltage range, Vo is the reference voltage, and Vmin, Vmax are minimum and maximum values of the applied voltage range for producing the target amount of displacement.

Further, to accomplish the object given above, according to the present invention, there is provided a device for driving piezo-electric elements by setting an amplitude (ΔV) of a range of voltages applied to the piezo-electric elements (1) in accordance with a target amount of displacement (ΔX), applying the voltages to the piezo-electric elements in accordance with the amplitude of the applied voltage range, and causing the target amount of displacement, the device comprising: (a) input means (3) for inputting the target amount of displacement (ΔX) and the reference voltage (Vo) relative to the applied voltage range; (b) memory means (4a) of arithmetic unit (4) for storing an approximate expression representing a relationship between the amplitude (ΔV) of the applied voltage range, a reference voltage (Vo) and an amount of displacement (G) per unit voltage of the piezo-electric element with respect to the piezo-electric element (1); (c) arithmetic means (4b) of arithmetic unit (4) for obtaining the amplitude (ΔV) of the applied voltage range for producing the target amount of displacement in the reference voltage by use of the target amount of displacement (ΔX) inputted from the input means, the reference voltage (Vo) and the approximate expression and thus determining the applied voltage range (Vmin~Vmax) for producing the target amount of displacement from the amplitude of the obtained applied voltage range and the inputted reference voltage; and (d) voltage generating means (2) for applying the voltages to the piezo-electric elements on the basis of the determined applied voltage range.

In the driving device described above, preferably, the approximate expression stored in the memory means (4a) is expressed such as:

$$G = aVo\Delta V + bVo + c\Delta V + d$$

where ΔV is the amplitude of the applied voltage range, Vo is the reference voltage, G is the amount of displacement per unit voltage, and a, b, c, d are coefficients determined depending on displacement characteristics of the piezo-electric elements.

Moreover, preferably, the approximate expression stored in the memory means (4a) is expressed such as:

$$G = k_{22}Vo^2\Delta V^2 + k_{21}Vo^2\Delta V + k_{20}Vo^2 + k_{12}Vo\Delta V^2 + k_{11}Vo\Delta V + k_{10}Vo + k_{02}\Delta V^2 + k_{01}\Delta V + k_{00}$$

where ΔV is the amplitude of the applied voltage range, Vo is the reference voltage, G is the amount of displacement per unit voltage, and $k_{22}, k_{21}, k_{20}, k_{12}, k_{11}, k_{10}, k_{02}, k_{01}, k_{00}$ are coefficients determined depending on the displacement characteristics of the piezo-electric elements.

Furthermore, in the driving device described above, preferably, the memory means (4a) stores a first relational expression between the target amount of displacement (ΔX), the amplitude (ΔV) of the applied voltage range and the amount of displacement (G) per unit voltage, and the arithmetic means (4a) calculates the amplitude (ΔV) of the applied voltage range for producing the target amount of displacement in the reference voltage from the inputted target amount of displacement, the reference voltage (Vo), the approximate expression and the first relational expression. In this instance, the first relational expression stored in the memory means (4a) is expressed such as:

$$G = \Delta X(A/\Delta V)$$

where ΔX is the target amount of displacement, ΔV is the amplitude of the applied voltage range, G is the amount of displacement per unit voltage, and A is the unit voltage.

Additionally, in the driving device described above, the memory means (4a) stores a second relational expression for determining the applied voltage range (Vmin~Vmax) for producing the target amount of displacement (ΔX) from the amplitude (ΔV) of the applied voltage range and the reference voltage (Vo), and the arithmetic means (4b) determines the applied voltage range (Vmin~Vmax) for producing the target amount of displacement from the amplitude of the applied voltage range that has been obtained by use of the approximate expression, the inputted reference voltage (Vo) and the second relational expression. In this case, the second relational expression stored in the memory means (4a) is expressed such as:

$$Vmin = Vo - (\Delta V/2)$$

$$Vmax = Vo + (\Delta V/2)$$

where ΔV is the amplitude of the applied voltage range, Vo is the reference voltage, and Vmin, Vmax are minimum and maximum values of the applied voltage range for producing the target amount of displacement.

Moreover, to accomplish the object explained above, according to the present invention, there is provided a system for controlling a micromotion mechanism, comprising: two piezo-electric elements (13a, 13b) as actuators for causing a probe (11) to scan the surface of a sample (12), the two piezo-electric elements being so constructed as to be orthogonal to each other, wherein each of the two piezo-electric elements (13a, 13b) is provided with the driving device described above.

BRIEF DESCRIPTION OF THE DRAWINGS

FIG. 5 is a chart showing displacement data measured in a variety of applied voltage ranges in the form of a Table;

FIG. 6 is a chart showing a matrix employed for obtaining an approximate expression in the first embodiment by use of a least squares method;

FIG. 7 is a chart showing a matrix algebra equation for similarly obtaining the approximate expression;

FIGS. 8(A)-8(C) are graphic charts showing characteristics of the approximate expression in the different applied voltage ranges;

FIG. 9 is a chart showing the displacement data used for determining the approximate expression in the form of a Table according to the piezo-electric element driving method in a second embodiment of this invention;

FIG. 10 is a chart showing a matrix employed for obtaining the approximate expression in the second embodiment by use of the least squares method;

FIG. 11 is a chart showing a matrix algebra equation for similarly obtaining the approximate expression in accordance with the second embodiment by use of the least squares method;

BEST MODE FOR CARRYING OUT THE INVENTION

Embodiments of this invention will hereinafter be described with reference to the accompanying drawings.

To start with, a piezo-electric element driving method and device in accordance with a first embodiment of the present invention will be explained with reference to FIGS. 3~6.

Figure 3:
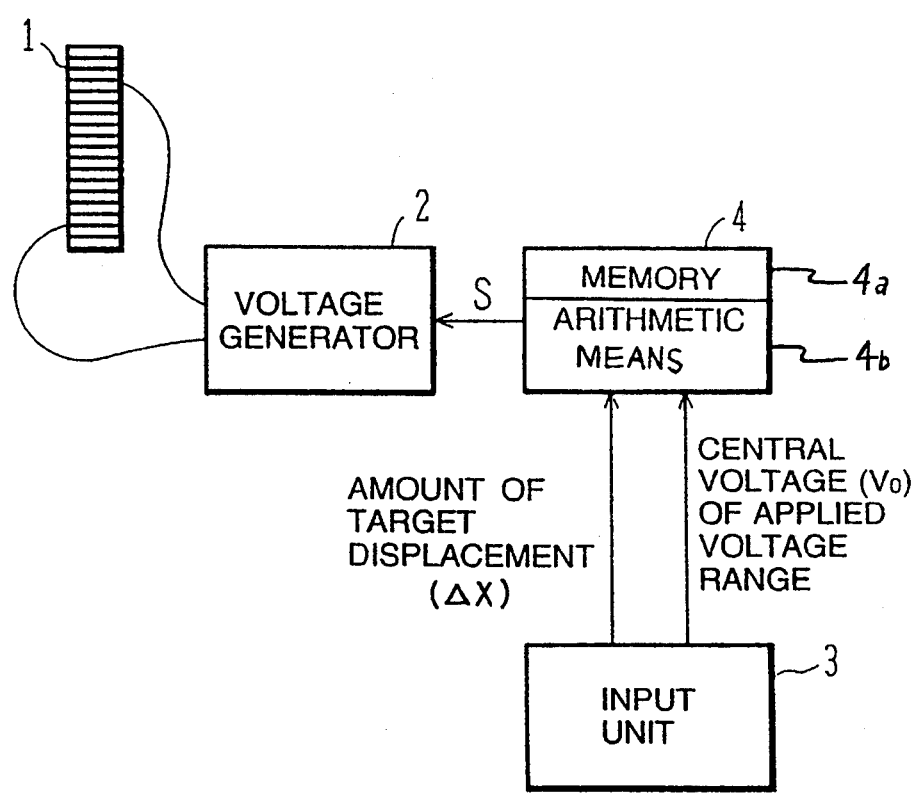
FIG. 3 is a diagram schematically illustrating a driving device for embodying a method of driving the piezo-electric elements in a first embodiment of this invention.

Referring to FIG. 3, the numeral 1 designates a piezo-electric element to be driven. The piezo-electric element 1 taking a laminated structure is formed in an elongated shape. The piezo-electric element 1 causes a displacement by changing a length in a longitudinal direction X with a voltage applied from a voltage generator 2. A magnitude of the voltage applied to the piezo-electric element 1 from the voltage generator 2 is determined in accordance with a target amount of displacement $\Delta X$ inputted by an input unit 3 and a reference voltage Vo relative to an applied voltage range. In this embodiment, the reference voltage Vo involves the use of a voltage value (hereinafter called a central voltage of the applied voltage range) centered in the applied voltage range. The target amount of displacement inputted by the input unit 3 and the central voltage Vo of the applied voltage range are transmitted to an arithmetic unit 4. The arithmetic unit 4 computes an applied voltage for generating the target amount of displacement $\Delta X$. A command signal S corresponding thereto is outputted to the voltage generator 2. The input unit 3 may be, e.g., a keyboard through which the operator effects inputting by key operations, or an interface for inputting the signals supplied from the outside.

The following is an explanation of the way of considering the calculation in the arithmetic unit 4. In the piezo-electric element 1, for generating the target amount of displacement, it is required that a driving voltage corresponding to this target amount of displacement be applied to the piezo-electric element 1. However, the amount of displacement generated in the piezo-electric element 1 differs depending on the applied voltage range. It is therefore impossible to determine the applied voltage by simply proportionally distributing displacement characteristics obtained in a broad range of applied voltages. Hence, in accordance with this embodiment, the central voltage Vo of the applied voltage range is inputted as well as inputting the above-mentioned target amount of displacement $\Delta X$. In this case, the central voltage Vo serves as a reference voltage for determining what location to employ in the voltage range where the piezo-electric element 1 is usable. Note that this reference voltage may, if the applied voltage range can be specified, involve the use of a voltage value existing in other positions instead of the voltage value centered in the applied voltage range as will be stated later.

Further, let $\Delta V$ be the amplitude of the applied voltage range of the piezo-electric element 1, and let G be the amount of displacement per unit voltage of the piezo-electric element 1. Obtained beforehand is an approximate expression showing a relationship between the amplitude $\Delta V$ of the applied voltage range thereof, the central voltage Vo of the applied voltage range and the amount of displacement G per unit voltage. This approximate expression will hereinafter be mentioned.

Figure 4:
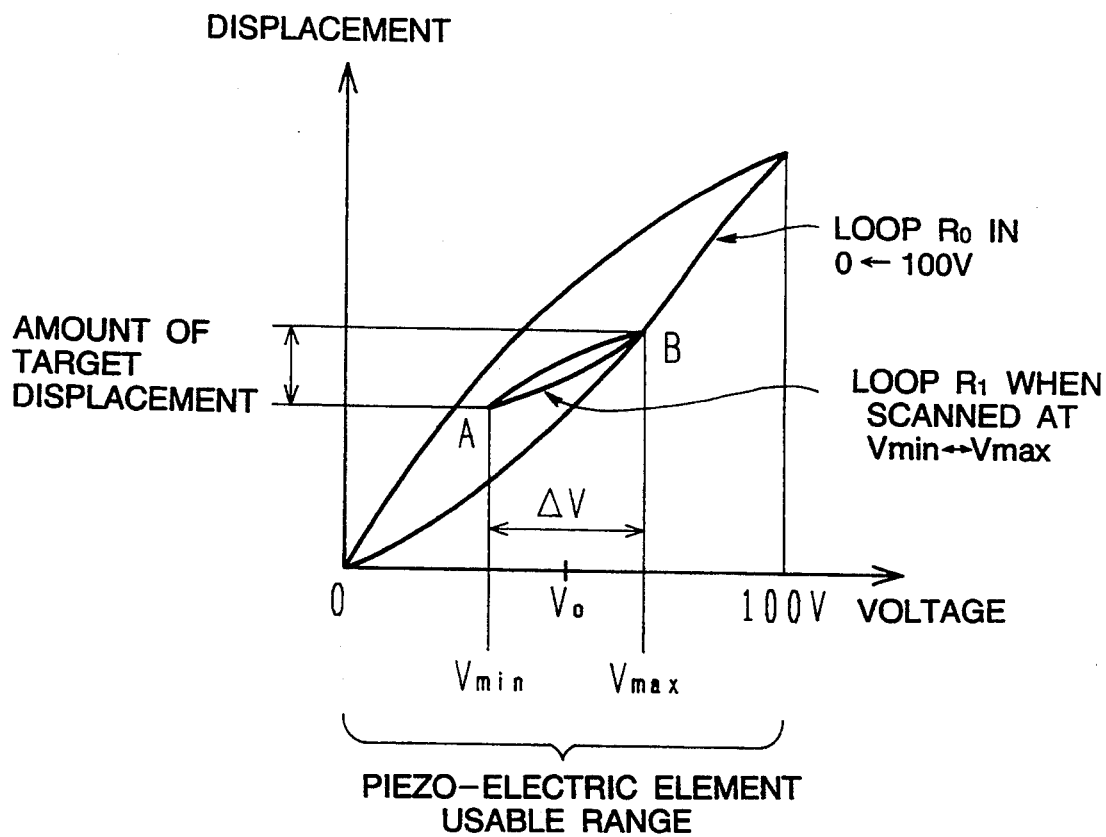
FIG. 4 is a graphic chart showing a relationship between a target amount of displacement ΔX, a central voltage Vo of an applied voltage range, an amplitude ΔV of the applied voltage range and an amount of displacement G per unit voltage.

Given herein is an explanation of a relationship between the target amount of displacement $\Delta X$, the central voltage Vo of the applied voltage range, the amplitude $\Delta V$ of the applied voltage range and the amount of displacement G per unit voltage with reference to FIG. 4. Paying attention to FIG. 4, when the usable voltage range of the piezo-electric element 1 is set to 0~100 V, the piezo-electric element 1 shifts as shown by a loop Ro when scanned in the usable voltage range of 0~100 V. The target amount of displacement $\Delta X$ and the central voltage Vo are values given by the input unit 3. The central voltage Vo becomes the reference voltage for determining what location to employ in the usable voltage range on the order of 0~100 V for the piezo-electric element 1. When the voltage is varied by an amplitude of $\Delta V$ with Vo being centered, the piezo-electric element exhibits a displacement characteristic as shown by the loop $R_1$. The piezo-electric element 1 shifts by the target amount of displacement $\Delta X$. The minimum value Vmin and the maximum value Vmax of the applied voltage range at this time are respectively given by:

$$Vmin = Vo - (\Delta V/2)$$

$$Vmax = Vo + (\Delta V/2) \qquad (1)$$

Figure 2:
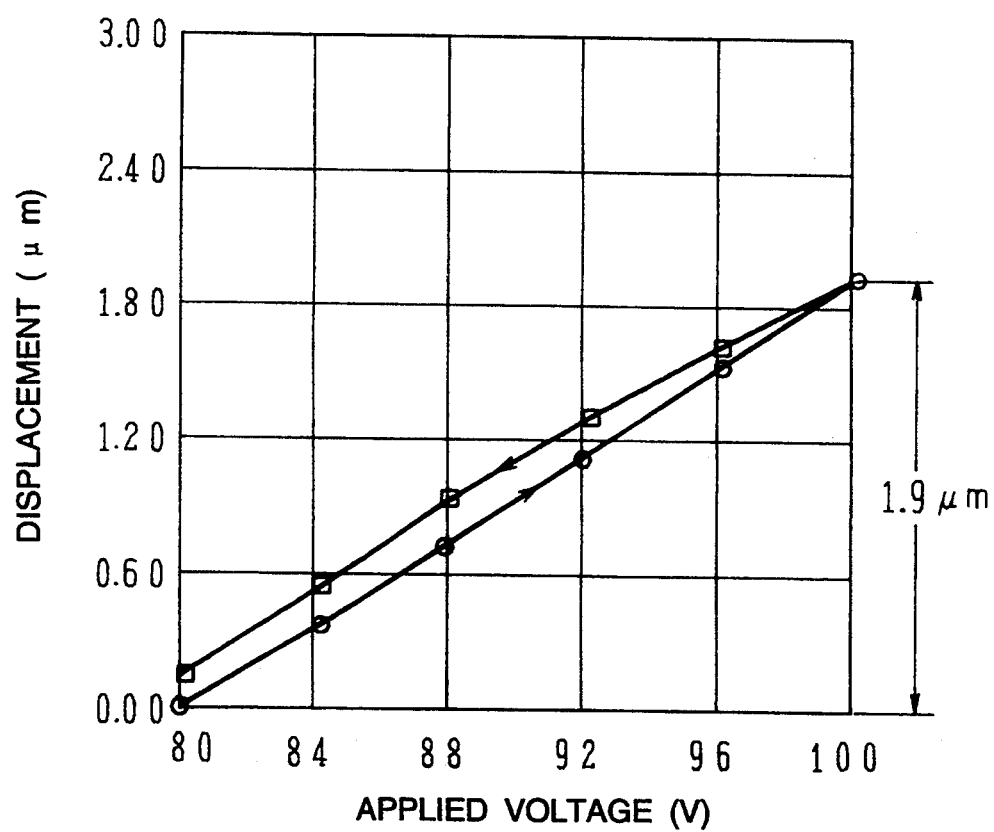
FIG. 2 is a graphic chart showing the displacement characteristics of the piezo-electric element in a range of 80~100 V.

The above-mentioned amplitude $\Delta V$ is equivalent to a difference (Vmin−Vmax) between the minimum value Vmin and the maximum value Vmax of this applied voltage range. Further, the amount of displacement G per unit voltage is expressed such as:

$$G = \Delta X(A/\Delta V) \qquad (2)$$

where A is the unit voltage. This corresponds to an inclination of a straight line connecting points A and B of the loop $R_1$ in FIG. 2.

Hence, if there is previously set the approximate expression showing the relationship between the amplitude $\Delta V$ of the applied voltage range, the central voltage of the applied voltage range and the amount of displacement ΔG per unit voltage, the target amount of displacement ΔX and the central voltage Vo are already known. Therefore, the amplitude of the applied voltage range is obtained from an approximate expression thereof and the formula (2) given above. The minimum value Vmin and the maximum value Vmax of the applied voltage range—i.e., an applied voltage range for generating the target amount of displacement ΔX—are obtained from this amplitude ΔV, the known central voltage Vo and the formula (1) given above.

Based on the conception described above, an internal memory 4a of the arithmetic unit 4 previously stores, with respect to the piezo-electric element 1, the approximate expression showing the relationship between the amplitude ΔV of the applied voltage range thereof, the central voltage Vo of the relevant applied voltage range and the amount of displacement G per unit voltage. The memory also stores the formula (2), i.e., the relational expression between the amount of displacement G per unit voltage, the target amount of displacement ΔX, the amplitude ΔV of the applied voltage range and the unit voltage A. The memory further stores the formula (1), i.e., the relational expression between the amplitude ΔV of the applied voltage range, the central voltage Vo of the applied voltage range and the applied voltage to the piezo-electric element 1.

An arithmetic means 4b of the arithmetic unit 4 inputs the data respectively on the target amount of displacement ΔX inputted from the input unit 3 and the central voltage Vo. The arithmetic unit 4 thereby calculates the amplitude ΔV of the range of the voltages to be applied to the piezo-electric elements 1 by use of the approximate expressions stored therein and the formula (2) given above. From this calculated amplitude ΔV and the central voltage Vo, the applied voltage range from Vmin to Vmax of the piezo-electric element 1 is calculated by use of the formula (1) described above. A command signal S corresponding thereto is then outputted to the voltage generator 2. Based on the command signal S, the voltage generator 2 applies the voltage corresponding to the calculated voltage range from Vmin to Vmax to the piezo-electric elements 1. Thus, a displacement corresponding to the target amount of displacement ΔX is generated in the piezo-electric element 1.

Next, the approximate expressions stored beforehand in the arithmetic unit 4 will be described.

At the first onset, the approximate expression created based on the linear expression will be explained. The central voltage Vo of the applied voltage range and the amplitude ΔV of the applied voltage range are varied by changing the applied voltage range of the piezo-electric elements 1 in many ways. A displacement caused in the piezo-electric element at that time is measured. A measured value of this displacement is converted into an amount of displacement per unit voltage on the order of 20 V, thereby obtaining the data shown in FIG. 5.

Referring to FIG. 5, the data numbers, e.g., 1~14 are written at the left end in the vertical direction. Written at the upper end in the horizontal direction are respective items of the applied voltage range (V: volt), the central voltage Vo (V) of this applied voltage range, the amplitude ΔV (V) of the applied voltage range and the converted value Gm (μm/20 V) of the amount of displacement per unit voltage (20 V). In accordance with this embodiment, the approximate expression of the linear expression is obtained by using the data shown in FIG. 5.

The approximate expression for determining the amount of displacement G per unit voltage is obtained by a formula based on the linear expression, wherein the central voltage Vo of the applied voltage range and the amplitude ΔV are parameters. To begin with, the expression is approximated by the simple linear expression with ΔV and G being related to each other and is thereby given such as:

$$G = k_1 \cdot \Delta V + k_2 \tag{3}$$

where $k_1$, $k_2$ vary depending on Vo. Hence, $k_1$, $k_2$ are each further approximated by the linear expressions as follows:

$$k_1 = k_3 Vo + k_4 \tag{4}$$

$$k_2 = k_5 Vo + k_6 \tag{5}$$

From the formulae (3)~(5), the amount of displacement G per unit voltage is given by:

$$G = k_3 Vo \Delta V + k_5 Vo + K_4 \Delta V + k_6 \tag{6}$$

When the coefficients $k_3$, $k_5$, $k_4$, $k_6$ in the formula (6) are rewritten respectively as a, b, c, d, the amount of displacement G is given by:

$$G = aVo\Delta V + bVo + c\Delta V + d \tag{7}$$

As expressed above, the amount of displacement G per unit voltage can be obtained by the approximate expression where the central voltage Vo is related to the voltage amplitude ΔV. In this approximate expression, the coefficients a, b, c, d are determined per piezo-electric element to be driven. In the case of this embodiment, fourteen sets of data obtained with respect to the piezo-electric elements 1 as shown in FIG. 5 are adapted to the formula (7) by using the least squares method, thereby determining the coefficients a, b, c, d. The approximate expression (7) is thus established.

The least squares method is a known arithmetic method but will be generally explained as below.

Now supposing that a formula such as $$z = axy + bx + cy + d$$

is approximated by n-sets of data of ($x_i$, $y_i$, $z_i$) [where i=1...n], a matrix shown in FIG. 6 is obtained. In this matrix, Σ representing an addition symbol implies an execution of addition of 1~n with respect to i.

When obtaining an inverse matrix $C^{-1}$ of the above-mentioned matrix, a~d can be obtained by the formula shown in FIG. 7. In this matrix algebra, $x_i$, $y_i$, $z_i$ correspond respectively to the central voltage Vo of the applied voltage range, the amplitude ΔV of the applied voltage range and the amount of displacement Gm per unit voltage in FIG. 5. When effecting a calculation by concretely substituting the data thereinto, the coefficients a, b, c, d in the approximate expression (7) are thereby obtainable.

As a matter of fact, when coefficients a, b, c, d are calculated in accordance with the calculating procedures described above by use of fourteen sets of data shown in FIG. 5, the above-mentioned approximate expression (7) is given by:

$$G = -0.000165 Vo \Delta V - 0.00442 Vo + 0.0175 \Delta V + 2.24 \tag{8}$$

This formula is an approximate expression used for controlling the displacement of the piezo-electric element 1. This approximate expression is stored in the internal memory of the arithmetic unit 4.

FIG. 8 shows a result of the approximation based on the approximate expression (8) in the form of graphs by respectively giving the central voltage. In each graph of FIG. 8, the axis of abscissa indicates the amplitude $\Delta V$ of the applied voltage range, while the axis of ordinate indicates the amount of displacement G per unit voltage. Referring to FIG. 8, (A) is a graph when the central voltage Vo is 50 V. In this case, when Vo=50 V, the approximate expression is given such as $$G = 0.00925\Delta V + 2.019.$$

Throughout FIG. 8, the straight lines are rectilinear graphs representing the above-mentioned approximate expressions. The plotted points marked with X indicate the as-plotted data values in the Table of FIG. 5. As obvious from FIG. 8(A), the straight lines are well approximated to the actual data. Similarly, FIG. 8(B) is a graph when the central voltage Vo is 20 V. FIG. 8(C) is a graph when the central voltage Vo is 80 V. In these cases also, the plotted measurement data are approximated at a high accuracy in accordance with approximate expressions established by respectively substituting values of the central voltage Vo. An error between the approximate expression (8) and the actual data in each voltage range shown in the Table of FIG. 5 is on the order of 4% at the maximum. Hence, the error is much smaller than in the prior art. The advantage thereof is remarkable.

As discussed above, the approximate expression (8) for controlling the displacement of the piezo-electric element 1 is prepared in the interior of the arithmetic unit 4. The input unit 3 gives the target amount of displacement $\Delta X$ and the central voltage Vo to the arithmetic unit 4. Then, the arithmetic unit 4 obtains the voltage amplitude $\Delta V$ by which the target amount of displacement $\Delta X$ is produced with Vo being the central voltage from the formula (2) and the formula (9) obtained as below by modifying the formula (8):

$$\Delta V = (G + 0.00442 Vo - 2.24)/(-0.000165 Vo + 0.0175) \quad (9)$$

Subsequently, the applied voltages Vmin, Vmax for producing the target amount of displacement $\Delta X$ are obtained by use of the formulae (1) and (2) from the amplitude $\Delta V$ of this voltage range and the reference voltage Vo given above. In this manner, the arithmetic unit 4 calculates, when receiving the target amount of displacement $\Delta X$ and the central voltage Vo, the amplitude $\Delta V$ of the voltage range. The arithmetic unit 4 further determines the applied voltage range from Vmin to Vmax for producing the target amount of displacement $\Delta X$ from the amplitude of this voltage range and the inputted reference voltage Vo. The voltage corresponding to this voltage range is applied to the piezo-electric element 1 to drive the piezo-electric element 1, thereby causing the target amount of displacement $\Delta X$.

Note that the above-mentioned formula (8) is stored as an approximate expression in the internal memory of the arithmetic unit 4 in accordance with the embodiment discussed above. The internal memory may, however, store the above-mentioned formula (7) defined as a general expression. The coefficients a, b, c, d may be separately calculated and inputted thereto. Further, the formula (9) as a modified expression of the formula (8) may be stored instead of the formula (8). The formula (9) is generalized such as:

$$\Delta V = (G - bVo - d)/(aVo + c) \quad (10)$$

This formula (10) may also be stored. Besides, similarly, the formula (2) described above may be stored as a modified expression given such as:

$$\Delta X = G(\Delta V/A) \quad (11)$$

In accordance with this embodiment, an approximate expression taking into consideration the displacement characteristic of the relevant piezo-electric element 1 is prepared beforehand in the driving unit for the piezo-electric elements 1. The applied voltage is determined by employing this approximate expression. Reduced consequently is an error caused due to the displacement characteristics of the piezo-electric elements in which the amounts of displacement differ depending on the applied voltage range. It is therefore possible to generate a highly accurate displacement. Further, there is no necessity for separately providing an expensive displacement measuring device such as a laser displacement gauge, etc. It is thus feasible to actualize an inexpensive and highly accurate micromotion mechanism.

The piezo-electric element driving method and device in accordance with a second embodiment will be described with reference to FIG. 9. A quadratic expression is used as an approximate expression in this embodiment.

As in the first embodiment, the parameters are the central voltage Vo of the applied voltage range and the amplitude $\Delta V$ thereof. When carefully seeing a state of the arrangement of the data points in, e.g., FIG. 8(A) given above, an upward convex curve is depicted. Hence, the accuracy is more improved with an approximation by the quadratic expression than approximated simply by the linear expression. Then, there is set an approximate expression using a 2-parameter quadratic expression wherein the quadratic expression is used both for Vo and for $\Delta V$ as shown below:

$$\begin{aligned}G &= (k_1 Vo^2 + k_2 Vo + k_3)(k_4 \Delta V^2 + k_5 \Delta V + k_6) \\ &= k_1 k_4 Vo^2 \Delta V^2 + k_1 k_5 Vo^2 \Delta V + k_1 K_6 Vo^2 + \\ &\quad k_2 k_4 Vo \Delta V^2 + k_2 k_5 Vo \Delta V + \\ &\quad k_2 k_6 Vo + k_3 k_4 \Delta V^2 + k_3 k_5 \Delta V + k_3 k_6\end{aligned} \quad (12)$$

where $k_1 \sim k_6$ are the coefficients.

The coefficients in the formula (12) are rewritten as follows:

$$G = k_{22} Vo^2 \Delta V^2 + k_{21} Vo^2 \Delta V + k_{20} Vo^2 + k_{12} Vo \Delta V^2 + k_{11} Vo \Delta V + k_{10} Vo + k_{02} \Delta V^2 + k_{01} \Delta V + k_{00} \quad (13)$$

In the approximate expression (13), the coefficients $k_{22} \sim k_{00}$ are determined per piezo-electric element to be driven. For instance, predetermined sets of data are adapted to the above-mentioned approximate expression (13) by use of the least squares method as in the preceding embodiment, thus determining the coefficients $k_{22} \sim k_{00}$. The approximate expression (13) is established in this way.

Given herein is an explanation of an applied example of the least squares method with respect to the approximate expression using the 2-parameter quadratic expression. As in the previous embodiment, it is assumed that the following formula is approximated by n-sets of data such as $(x_i, y_i, z_i)$ [where $i=1 \ldots n$].

$$z = k_{22}x^2y^2 + k_{21}x^2y + k_{20}x^2 + k_{12}xy^2 + k_{11}xy + k_{10}x + k_{02}y^2 + k_{01}y + k_{00}$$

A matrix shown in FIG. 10 is considered.

Figure 1:
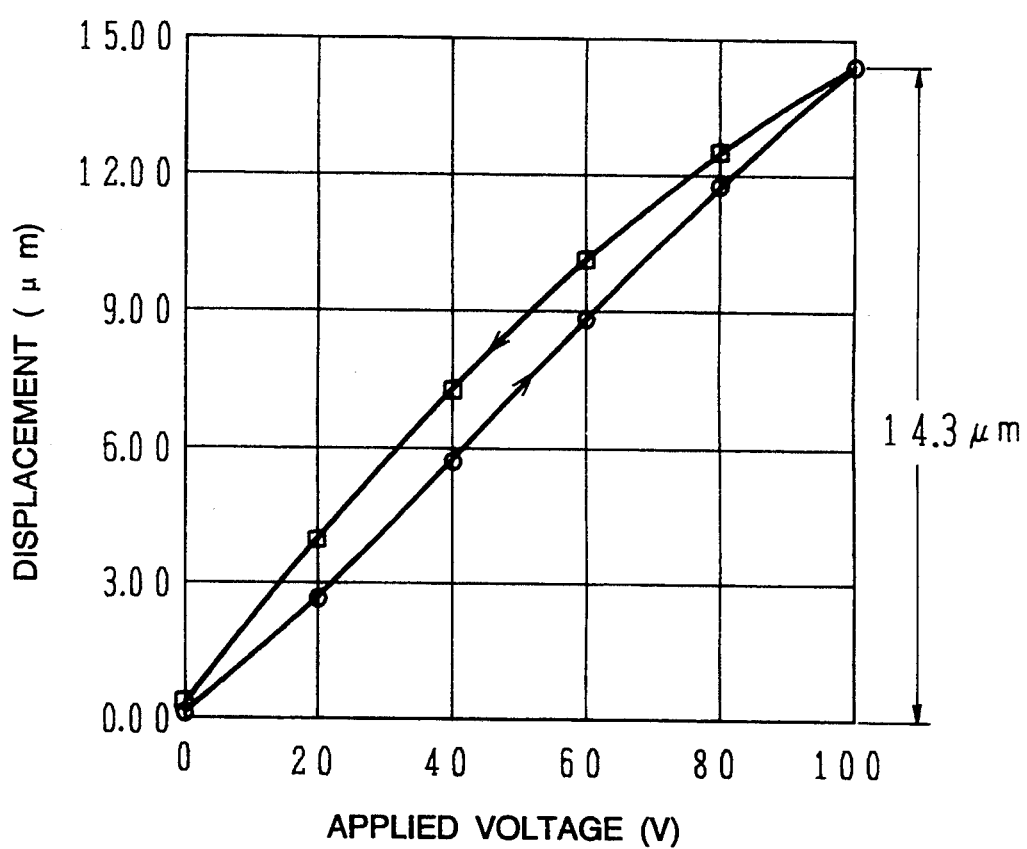
FIG. 1 is a graphic chart showing displacement characteristics of a piezo-electric element in a range of 0~100 V.

When obtaining an inverse matrix $C^{-1}$ of the above-mentioned matrix, the coefficients $k_2 \sim k_{00}$ are obtained by the formula shown in FIG. 1.

When performing the calculation by concretely substituting the data thereinto, the coefficients $k_{22} \sim k_{00}$ in the approximate expression (13) can be obtained.

Herein, the coefficients $k_{22} \sim k_{00}$ are actually calculated by employing the data shown in the Table of FIG. 9. Namely, in the matrix algebra equation shown in FIG. 11, $x_i$, $y_i$, $z_i$ correspond to the central voltage Vo of the applied voltage range, the amplitude $\Delta V$ of the applied voltage range and the amount of displacement Gm per unit voltage in FIG. 9. When effecting the calculation by concretely substituting the data thereinto, the coefficients $k_{22} \sim k_{00}$ in the approximate expression (13) described above are given as follows:

$$k_{22} = 1.932 \times 10^{-9}$$

$$k_{21} = -2.467 \times 10^{-7}$$

$$k_{20} = -1.159 \times 10^{-4}$$

$$k_{12} = 7.775 \times 10^{-7}$$

$$k_{11} = -3.814 \times 10^{-4}$$

$$k_{10} = -5.340 \times 10^{-5}$$

$$k_{02} = -2.411 \times 10^{-4}$$

$$k_{01} = 6.553 \times 10^{-2}$$

$$k_{00} = 5.512$$

The symbol G in the Table of FIG. 9 is the amount of displacement per unit voltage of 100 V obtained by the calculation in the approximate expression (13) using the above-described coefficients. A difference between Gm and G in the Table of FIG. 9 is an error when using the approximate expression (13). The error whose value is indicated by % is shown in the right end of the Table of the Figure. It can be understood that even the maximum error is on the order of 1.3%, enough to show an extremely good approximation.

Considered is an error when the approximate expression (13) is not used in the measurement data shown in FIG. 9. In this case, it follows that 7.84 $\mu$m/100 V exhibiting a characteristic of 0—100 V is used generally as a reference value of the amount of displacement per unit voltage. Contrastingly, 4.57 $\mu$m/100 V comes out in the characteristic of 95–100 V in the lowermost stage in FIG. 9. If the approximate expression (13) is not employed, a difference therebetween directly turns out an error. The error in this instance is expressed such as $(7.84 - 4.57)/7.84 = 0.417$. The error is actually as large as 41.7%.

As explained above, the error of 41.7% at the maximum is corrected down to 1.3% or less in the approximate expression (13). Consequently, there conspicuously appears an advantage of the method of driving the piezo-electric elements, which utilizes the approximate expression (13).

In accordance with this embodiment, the internal memory of the arithmetic unit 4 illustrated in FIG. 3 stores the above-mentioned calculated values of the coefficients $k_{22} \sim k_{00}$ obtained from the data in FIG. 9 as well as from the approximate expression (13) given above in place of the formula (8) of the first embodiment.

Hence, according to this embodiment, the displacement exhibiting a higher accuracy than in the first embodiment can be produced in the piezo-electric element 1.

Note that the linear expression is employed as an approximate expression in the first embodiment, while the quadratic expression is used in the second embodiment. In this case, the linear expression in the first embodiment is applied when effecting a simple approximation. The quadratic expression in the second embodiment is applied when performing a more precise approximation. The approximate expressions may be selected according to the accuracies required respectively and then utilized. Further, when performing the approximation at a still higher accuracy, an approximation of the third or higher degree can be similarly set and then applied.

Incidentally, each embodiment discussed above has been explained such that the central voltage (defined as a central value of the applied voltage range) is employed in the form of the reference voltage for specifying a range of the voltages to be applied. As explained earlier, however, voltages other than the central voltage that are set in a predetermined relationship with the applied voltage range are also usable. Exemplified as other voltages are minimum and maximum voltage values of the applied voltage range, or values of voltages other than the central voltage within the applied voltage range. If the voltage other than the central voltage is employed as a reference voltage, though the structure of, e.g., the approximate expression (7) is the same in the embodiments discussed above, the values of the coefficients a$\sim$d thereof are properly determined in accordance with the voltage selected as the reference voltage. The situation is the same with the embodiment of the quadratic expression.

Further, if the voltage other than the central voltage is used as the reference voltage, a formula for obtaining the applied voltages Vmin, Vmax from the amplitude $\Delta V$ of the applied voltage range and the reference voltage Vo is different from the formula (1). For example, when the minimum voltage value Vmin of the applied voltage range is used as the reference voltage Vo, the following formulae are employed in place of the formula (1).

$$Vmin = Vo$$

$$Vmax = Vo + \Delta V$$

Similarly, when the maximum voltage value Vmax of the applied voltage range is used as the reference voltage Vo, the following formulae are employed.

$$Vmin = Vo - \Delta V$$

$$Vmax = Vo$$

If a value of the voltage other than the central voltage within the applied voltage range is employed as the reference voltage Vo, a relationship between the reference voltage Vo and the applied voltage range Vmin~-Vmax is given by:

$$Vo = Vmin + (Vmax - vmin)a/(a+b)$$

where a, b are the voltage widths obtained by partitioning the amplitude $\Delta V$ of the applied voltage range on the basis of a position of the reference voltage Vo. Accordingly, Vmin, Vmax can be calculated by use of the following formulae.

$$Vmin = Vo - \Delta V\{a/(a+b)\}$$

$$Vmax = Vo + \Delta V\{b/(a+b)\}$$

As explained above, the reference voltage for specifying the applied voltage range can be arbitrarily determined if set in the predetermined relationship with the applied voltage range.

Next, an applied example of a scan type tunnel microscope using the device for driving the piezo-electric elements will be described with reference to FIGS. 12 and 13.

Figure 12:
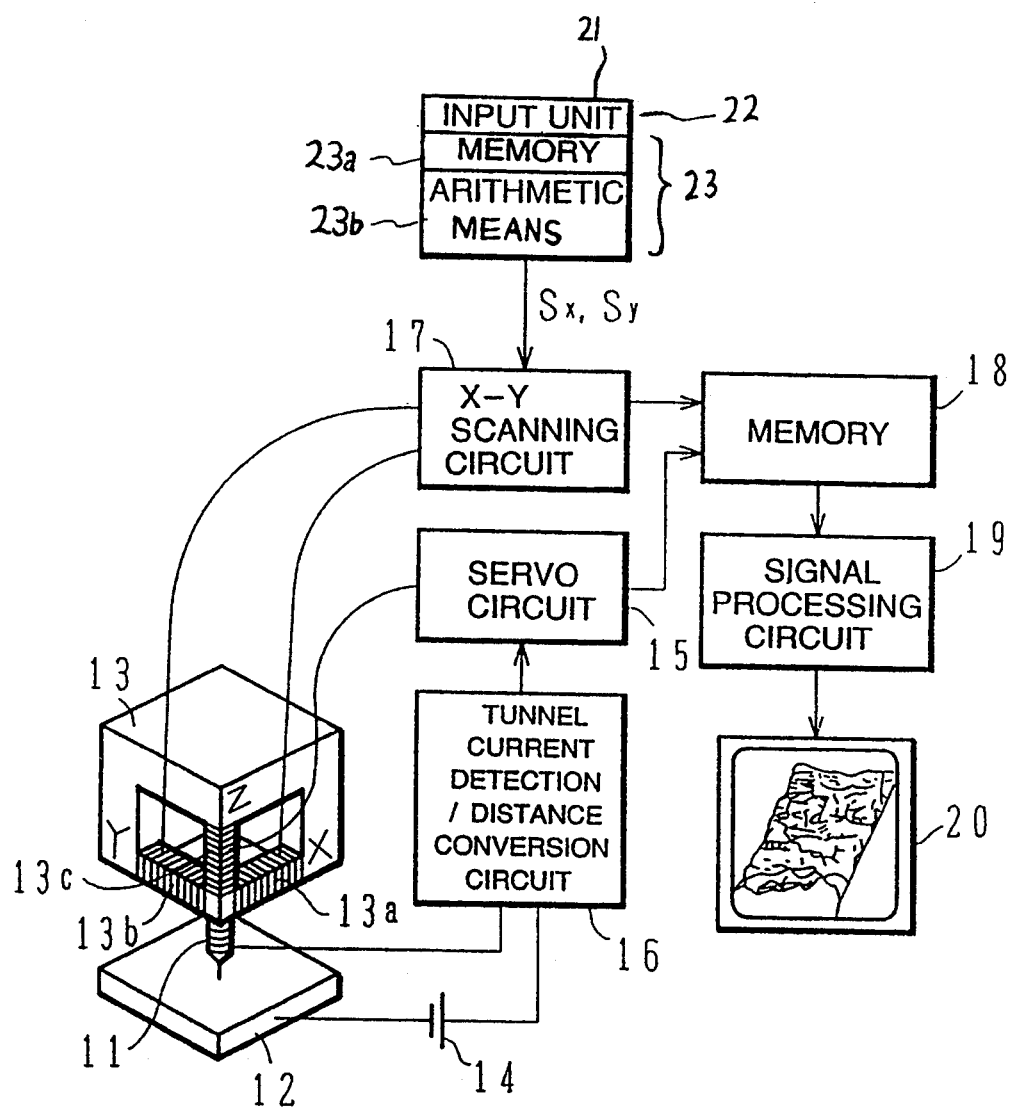
FIG. 12 is a view schematically illustrating a system for controlling a micromotion mechanism in a scan type tunnel microscope to which the piezo-electric element driving device of the present invention is applied.

Paying attention first to FIG. 12, the tip of a probe 11 is perpendicularly set in a face-to-face relationship with a measured surface of a sample 12. The probe 11 is fixed to a three-dimensional piezo-electric actuator 13. The actuator 13 includes piezo-electric elements 13a, 13b, 13c extending in X-, Y-, and Z-axis directions. The probe 11 is secured at the perpendicular intersection of the three piezo-electric elements 13a~13c. The piezo-electric elements 13a, 13b are actuators for causing the probe 11 to perform an X-Y scan (a plane scan) along the surface of the sample 12. The piezo-electric element 13c is a Z-directional actuator for controlling a distance (height) between the probe 11 and the surface of the sample 12 by shifting a position of the probe in the direction Z.

A power supply 14 is connected between the probe 11 and the sample 12. A tunnel current flows between the probe 11 and the sample 12 when the probe approaches the surface of the sample 12 at a distance as near as an atomic size. This phenomenon appears based on a tunnel phenomenon derived from a quantum effect. The distance between the probe 11 and the surface of the sample 12 is controlled with an elongation and shrinkage of the piezo-electric element 13c described above. An elongating/shrinking quantity of the piezo-electric element 13c is determined by a voltage applied to the piezo-electric element 13c. The voltage applied to the piezo-electric element 13c is imparted from a servo circuit 15.

A measuring operation in the scan type tunnel microscope starts with setting the probe 11 and the sample 12 at a fixed distance (on the basis of a magnitude of the tunnel current). When the probe 11 effects scanning, the tunnel current is detected. The piezo-electric element 13c is servo-controlled to hold the probe 11 and the sample 12 at the fixed distance by holding this tunnel current at a fixed level. With this operation, the probe 11 moves along an atom-sized rugged configuration on the surface of the sample 12. The rugged configuration on the sample surface can be therefore measured based on control data for moving the probe 11.

Referring to FIG. 12, the tunnel current described above is detected and amplified by a tunnel current detection/distance conversion circuit 16. The tunnel current detection/distance conversion circuit 16 incorporates a function to convert a value of this current into a distance (voltage value). A signal outputted from the tunnel current detection/distance conversion circuit 16 is transmitted to the servo circuit 15. The servo circuit 15 sets a voltage for regulating a movement of the probe 11 so that the output signal from the tunnel current detection/distance conversion circuit 16 comes to a predetermined fixed value. The servo circuit 15 then supplies the piezo-electric element 13c with this voltage. Further, actions of the piezo-electric elements 13a, 13b for causing the probe 11 to perform scanning are controlled by an X-Y scanning circuit 17.

When causing the elongations and shrinkages of the piezo-electric elements 13a~13c, a memory 18 is supplied with and stores the Z-directional control data generated by the servo circuit 15 and the X- and Y-directional control data generated by the X-Y scanning circuit 17. The control data for execution of the measurement by the probe 11 that are stored in the memory 18 serve directly as measurement data representing the rugged configuration on the sample surface. The measurement data are processed by a signal processing circuit 19. An image of the measured sample surface is displayed on the screen of a display unit 20 on the basis of image data prepared by this processing.

When the probe 11 scans the measurement surface of the sample 12, the elongations and shrinkages of the piezo-electric elements 13a, 13b are controlled at a predetermined timing. The scan depending on the elongations and shrinkages of the piezo-electric elements 13a, 13b is conducted based on the driving voltage imparted from the X-Y scanning circuit 17. The driving voltage given from the X-Y scanning circuit 17 is generated based on command signals Sx, Sy transmitted from a computer 21.

The computer 21 includes an input unit 22 corresponding to the input unit 3 shown in FIG. 3 and an arithmetic unit 23 corresponding to the arithmetic unit 4. The computer 21 inputs target amounts of displacement $\Delta X$, $\Delta Y$ and reference voltages $V_{XO}$, $V_{YO}$ with respect to the applied voltage range to the piezo-electric elements 13a, 13b, respectively. Minimum values Vxmin, Vymin and maximum values Vxmax, Vymax of the applied voltage are thereby determined.

That is, the input unit 22 incorporates a function to input the target amount of displacement $\Delta V$ and the reference voltage $V_{XO}$ to the piezo-electric element 13a, and the target amount of displacement $\Delta Y$ and the reference voltage $V_{YO}$ to the piezo-electric element 13b. Further, an internal memory 23a of the arithmetic unit 23 stores the above-mentioned approximate expression (8) and the relational expressions (1), (2) relative to the piezo-electric element 13a, and also the above-described approximate expression (8) and the relational expressions (1), (2) relative to the piezo-electric element 13b.

When the target amount of displacement $\Delta X$ and the reference voltage $V_{XO}$ are inputted, an arithmetic means 23b of the arithmetic unit 23 calculates an amplitude $\Delta Vx$ of the range of voltage to be applied to the piezo-electric element 13a by using the inputted target amount of displacement $\Delta X$, the central voltage $V_{XO}$, the approximate expression (8) and the relational expression (2). The arithmetic unit 23 also calculates the minimum value Vxmin and the maximum value Vxmax of the voltage to be applied to the piezo-electric element 13a from the calculated amplitude $\Delta Vx$ and the central voltage $V_{XO}$ by use of the above-mentioned formula (1). Command signals Sx corresponding thereto are outputted to the X-Y scanning circuit 17. Similarly, when the target amount of displacement ΔY and the reference voltage $V_{YO}$ are inputted, the arithmetic unit 23 calculates the amplitude ΔVy of the range of voltage to be applied to the piezo-electric element 13b by use of the inputted target amount of displacement ΔY, the central voltage $V_{YO}$, the approximate expression (10) and the relational expression (2). The arithmetic unit 23 also calculates the minimum value Vymin and the maximum value Vymax of the voltage applied to the piezo-electric element 13b from the calculated amplitude ΔVy and the central voltage $V_{YO}$ by employing the above-mentioned formula (1). Command signals Sy corresponding thereto are outputted to the X-Y scanning circuit 17.

Figure 13:
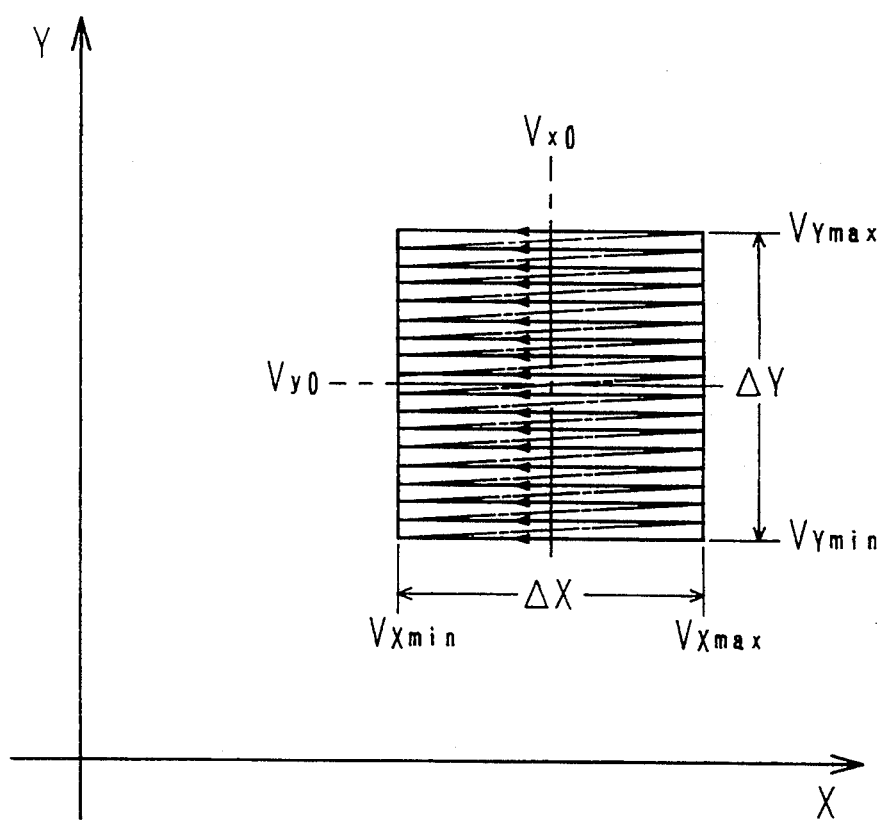
FIG. 13 is a graphic chart showing a relationship between an applied voltage and a scan area controlled by the control device illustrated in FIG. 12.

On the basis of the command signals Sx, Sy, the X-Y scanning circuit 17 outputs a driving voltage to effect plane-scanning by the probe 11 as illustrated in FIG. 13. More specifically, an area between the minimum value Vxmin and the maximum value Vxmax of the applied voltage is partitioned equally into, e.g., 200~500 segments with resect to the command signal Sx. Voltage values corresponding thereto are obtained. The voltage decreasing sequentially from Vxmax to Vxmin is applied to the piezo-electric element 13a. With this application, the piezo-electric element 13a generates displacements corresponding to respective points of 100~500 from Vxmax to Vxmin. The probe 11 scans the positions corresponding thereto. At this time, the servo circuit 15 permits the memory 18 to store, as described above, the Z-directional control data at the respective points of 200~500 from Vxmax to Vxmin. The measurement data representing the rugged configuration on the sample surface is thereby obtained.

On the other hand, an area between the minimum value Vymin and the maximum value Vymax of the applied voltage is similarly partitioned equally into, e.g., 200~500 with respect to the command signal Sy. Voltage values corresponding thereto are obtained. The voltages increasing sequentially from Vymin to Vymax are applied to the piezo-electric element 13b. With this application, the piezo-electric element 13b generates a displacement corresponding to the respective points of 200~500 from Vymin to Vymax. The probe 11 scans positions corresponding thereto. At this moment, a timing for applying the voltage is controlled to execute the application thereof when the driving voltage for the piezo-electric element reaches the minimum value Vxmin. Obtained consequently are the measurement data about the area between Vxmax to Vxmin at the respective points of 200~500 from Vymin to Vymax. The measurement data about the entire plane area defined by the target displacements ΔX, ΔY are acquired.

Note that the plane area defined by the target displacements ΔX, ΔY is determined by the reference voltages $V_{XO}$, $V_{YO}$. Therefore, other plane areas are scanned by changing the reference voltages $V_{XO}$, $Y_{YO}$, thereby obtaining the measurement data.

In accordance with this embodiment, it is possible to obtain the highly accurate measurement data in the micromotion mechanism of the scan type tunnel microscope that has little extra space for installing a displacement measuring device.

INDUSTRIAL APPLICABILITY

As is obvious from the explanation given above, according to the present invention, the driving device for the piezo-electric elements is prepared beforehand with the approximate expression taking into consideration the displacement characteristic of the relevant piezo-electric element. The applied voltage is determined by use of this approximate expression. The error caused due to the displacement characteristics of the piezo-electric elements whose amounts of displacement differ depending on the applied voltage range is minimized. It is feasible to generate highly accurate displacement. Further, there is no necessity for separately providing an expensive displacement measuring device such as a laser displacement gauge, etc. The inexpensive micromotion mechanism exhibiting the high accuracy is attainable. Besides, the highly accurate measurement data can be acquired in the micromotion mechanism of the scan type probe microscope which has little extra space for installing the displacement measuring device.

In addition, the linear expression is applied as the approximate expression when performing the simple approximation. The quadratic expression is applied when effecting the more precise approximation. The approximate expressions can be selected depending on the accuracies required respectively and then utilized.

What is claimed is:

1. A method of driving a piezo-electric element by setting an amplitude (ΔV) of a range of a voltage applied to said piezo-electric element in accordance with a target amount of displacement (ΔX), applying the voltage to said piezo-electric element in accordance with said amplitude of said applied voltage range and causing said target amount of displacement, said method comprising the steps of:

(a) setting an approximate expression representing a relationship between said amplitude (ΔV) of said applied voltage range, a reference voltage (Vo) relative to said applied voltage range and an amount of displacement (G) per unit voltage of said piezo-electric element with respect to said piezo-electric element;

(b) obtaining said amplitude (ΔV) of said applied voltage range for producing said target amount of displacement in said reference voltage by inputting said target amount of displacement (ΔX) and said reference voltage (Vo) and using said approximate expression;

(c) determining said applied voltage range (Vmin~Vmax) for producing said target amount of displacement from said obtained amplitude of said applied voltage range and said inputted reference voltage (Vo); and (d) applying said voltage to said piezo-electric element on the basis of said applied voltage range determined.

2. The method according to claim 1, wherein said approximate expression set by the step (a) is a linear function of the said amplitude (ΔV) of said applied voltage range, said reference voltage (Vo) and said amount of displacement (G) per unit voltage.

3. The method according to claim 1, wherein said approximate expression set by the step (a) is $$G = aVo\Delta V + bVo + C\Delta V + d$$

where ΔV is said amplitude of said applied voltage range, Vo is said reference voltage, G is said amount of displacement per unit voltage, and a, b, c, d are coefficients determined depending on displacement characteristics of said piezo-electric element.

4. The method according to claim 1, wherein said approximate expression set by the step (a) is a quadratic expression of said amplitude (ΔV) of said applied voltage range, said reference voltage (Vo) and said amount of displacement (G) per unit voltage.

5. The method according to claim 1, wherein said approximate expression set by the step (a) is $$G = k_{22}Vo^2\Delta V^2 + k_{21}Vo^2\Delta V + k_{20}Vo^2 + k_{12}Vo\Delta V^2 + k_{11}Vo\Delta V + k_{10}Vo + k_{02}\Delta V^2 + k_{01}\Delta V + k_{00}$$

where ΔV is said amplitude of said applied voltage range, Vo is said reference voltage, G is said amount of displacement per unit voltage, and $k_{22}$, $k_{21}$, $k_{20}$, $k_{12}$, $k_{11}$, $k_{10}$, $k_{02}$, $k_{01}$, $k_{00}$ are coefficients determined depending on the displacement characteristics of said piezo-electric element.

6. The method according to claim 1, wherein said reference voltage (Vo) is a voltage value centered in said amplitude (ΔV) of said applied voltage range.

7. The method according to claim 1, wherein said reference voltage (Vo) is a maximum voltage value (Vmax) or a minimum voltage value (Vmin) of said amplitude (ΔV) of said applied voltage range.

8. The method according to claim 1, further comprising the step of setting further a first relational expression between said target amount of displacement (ΔX), said amplitude (ΔV) of said applied voltage range and said amount of displacement (G) per unit voltage, wherein in step (b), said amplitude (ΔV) of said applied voltage range is obtained from said inputted target amount of displacement, said reference voltage (Vo), said approximate expression and said first relational expression.

9. The method according to claim 8, wherein said first relational expression is $$G = \Delta X (A/\Delta V)$$

where ΔX is said target amount of displacement, ΔV is said amplitude of said applied voltage range, G is said amount of displacement per unit voltage, and A is said unit voltage.

10. The method according to claim 1, further comprising the step of setting further a second relational expression for determining said applied voltage range (Vmin~Vmax) for producing said target amount of displacement (ΔX) from said amplitude (ΔV) of said applied voltage range and said reference voltage (Vo), wherein in step (c), said applied voltage range (Vmin~Vmax) for producing said target amount of displacement is determined from said amplitude of said applied voltage range that has been obtained by use of said approximate expression, said inputted reference voltage (Vo) and said second relational expression in the step (c).

11. The method according to claim 10, wherein said second relational expression is $$Vmin = Vo - (\Delta V/2)$$

$$Vmax = Vo + (\Delta V/2)$$

where ΔV is said amplitude of said applied voltage range, Vo is said reference voltage, and Vmin, Vmax are minimum and maximum values of said applied voltage range for producing said target amount of displacement.

12. The method according to claim 2, wherein said reference voltage (Vo) is a voltage value centered in said amplitude (ΔV) of said applied voltage range.

13. The method according to claim 3, wherein said reference voltage (Vo) is a voltage value centered in said amplitude (ΔV) of said applied voltage range.

14. The method according to claim 4, wherein said reference voltage (Vo) is a voltage value centered in said amplitude (ΔV) of said applied voltage range.

15. The method according to claim 5, wherein said reference voltage (Vo) is a voltage value centered in said amplitude (ΔV) of said applied voltage range.

16. The method according to claim 2, wherein said reference voltage (Vo) is a maximum voltage value (Vmax) or a minimum voltage value (Vmin) of said amplitude (ΔV) of said applied voltage range.

17. The method according to claim 3, wherein said reference voltage (Vo) is a maximum voltage value (Vmax) or a minimum voltage value (Vmin) of said amplitude (ΔV) of said applied voltage range.

18. The method according to claim 4, wherein said reference voltage (Vo) is a maximum voltage value (Vmax) or a minimum voltage value (Vmin) of said amplitude (ΔV) of said applied voltage range.

19. The method according to claim 5, wherein said reference voltage (Vo) is a maximum voltage value (Vmax) or a minimum voltage value (Vmin) of said amplitude (ΔV) of said applied voltage range.

20. A device for driving a piezo-electric element by setting an amplitude (ΔV) of a range of voltages applied to said piezo-electric element in accordance with a target amount of displacement (ΔX), applying the voltages to said piezo-electric element in accordance with said amplitude of said applied voltage range, and causing said target amount of displacement, said device comprising:
(a) input means for inputting said target amount of displacement (ΔX) and said reference voltage (Vo) relative to said applied voltage range;
(b) memory means for storing an approximate expression representing a relationship between said amplitude (ΔV) of said applied voltage range, a reference voltage (Vo) and an amount of displacement (G) per unit voltage of said piezo-electric element with respect to said piezo-electric element;
(c) arithmetic means for retrieving said target amount of displacement (ΔX) and said reference voltage (Vo) from said input means and said approximate expression from said memory means, for obtaining said amplitude of said applied voltage range from said approximate expression, and for thus determining said applied voltage range for producing said target amount of displacement from said amplitude of said obtained applied voltage range and said inputted reference voltage; and
(d) voltage generating means for receiving the applied voltage range determined by said arithmetic means, and for generating and applying the voltages to said piezo-electric element on the basis of said applied voltage range determined by said arithmetic means.

21. The device according to claim 20, wherein said approximate expression stored in said memory means is $$G = aVo\Delta V + bVo + c\Delta V + d$$

where ΔV is said amplitude of said applied voltage range, Vo is said reference voltage, G is said amount of displacement per unit voltage, and a, b, c, d are coefficients determined depending on displacement characteristics of said piezo-electric element.

22. The device according to claim 20, wherein said approximate expression stored in said memory means is $$G = k_{22}Vo^2\Delta V^2 + k_{21}Vo^2\Delta V + k_{20}Vo^2 + k_{12}Vo\Delta V^2 + k_{11}Vo\Delta V + k_{10}Vo + k_{02}\Delta V^2 + k_{01}\Delta V + k_{00}$$

where $\Delta V$ is said amplitude of said applied voltage range, Vo is said reference voltage, G is said amount of displacement per unit voltage, and $k_{22}$, $k_{21}$, $k_{20}$, $k_{12}$, $k_{11}$, $k_{10}$, $k_{02}$, $k_{01}$, $k_{00}$ are coefficients determined depending on the displacement characteristics of said piezo-electric element.

23. The device according to claim 20, where said memory means stores a first relational expression between said target amount of displacement ($\Delta X$), said amplitude ($\Delta V$) of said applied voltage range and said amount of displacement (G) per unit voltage, and said arithmetic means calculates said amplitude ($\Delta V$) of said applied voltage range from said inputted target amount of displacement, said reference voltage (Vo), said approximate expression and said first relational expression.

24. The device according to claim 23, wherein said first relational expression stored in said memory means is $$G = \Delta X(A/\Delta V)$$

where $\Delta X$ is said target amount of displacement, $\Delta V$ is said amplitude of said applied voltage range, G is said amount of displacement per unit voltage, and A is said unit voltage.

25. The device according to claim 20, wherein said memory means stores a second relational expression for determining said applied voltage range for producing said target amount of displacement ($\Delta X$) from said amplitude ($\Delta V$) of said applied voltage range and said reference voltage (Vo), and said arithmetic means determines said applied voltage range from said amplitude ($\Delta V$) of said applied voltage range that has been obtained by use of said approximate expression, said inputted reference voltage (Vo) and said second relational expression.

26. The device according to claim 25, wherein said second relational expression stored in said memory means is $$Vmin = Vo - (\Delta V/2)$$

$$Vmax = Vo + (\Delta V/2)$$

where $\Delta V$ is said amplitude of said applied voltage range, Vo is said reference voltage, and Vmin, Vmax are minimum and maximum values of said applied voltage range for producing said target amount of displacement.

27. A system for controlling a micromotion mechanism, comprising:
two piezo-electric elements as actuators for causing a probe to scan the surface of a sample, said two piezo-electric elements being so constructed as to be orthogonal to each other; and
said driving device as set forth in claim 12 for driving each of said two piezo-electric elements.

28. A system for controlling a micromotion mechanism, comprising:
two piezo-electric elements as actuators for causing a probe to scan the surface of a sample, said two piezo-electric elements being so constructed as to be orthogonal to each other; and
said driving device as set forth in claim 21 for driving each of said two piezo-electric elements.

29. A system for controlling a micromotion mechanism, comprising:
two piezo-electric elements as actuators for causing a probe to scan the surface of a sample, said two piezo-electric elements being so constructed as to be orthogonal to each other; and
said driving device as set forth in claim 22 for driving each of said two piezo-electric elements.

30. A system for controlling a micromotion mechanism, comprising:
two piezo-electric elements as actuators for causing a probe to scan the surface of a sample, said two piezo-electric elements being so constructed as to be orthogonal to each other; and
said driving device as set forth in claim 23 for driving each of said two piezo-electric elements.

31. A system for controlling a micromotion mechanism, comprising:
two piezo-electric elements as actuators for causing a probe to scan the surface of a sample, said two piezo-electric elements being so constructed as to be orthogonal to each other; and
said driving device as set forth in claim 24 for driving each of said two piezo-electric elements.

32. A system for controlling a micromotion mechanism, comprising:
two piezo-electric elements as actuators for causing a probe to scan the surface of a sample, said two piezo-electric elements being so constructed as to be orthogonal to each other; and
said driving device as set forth in claim 25 for driving each of said two piezo-electric elements.

33. A system for controlling a micromotion mechanism, comprising:
two piezo-electric elements as actuators for causing a probe to scan the surface of a sample, said two piezo-electric elements being so constructed as to be orthogonal to each other; and
said driving device as set forth in claim 26 for driving each of said two piezo-electric elements.

* * * * *